United States Patent
Ogihara (10) Patent No.: US 12,183,636 B2
(45) Date of Patent: Dec. 31, 2024

(54) SEMICONDUCTOR SUBSTRATE, METHOD FOR MANUFACTURING SEMICONDUCTOR SUBSTRATE AND METHOD FOR MANUFACTURING SEMICONDUCTOR DEVICE

(71) Applicant: FILNEX INC., Tokyo (JP)

(72) Inventor: Mitsuhiko Ogihara, Tokyo (JP)

(73) Assignee: Filnex Inc., Tokyo (JP)

( * ) Notice: Subject to any disclaimer, the term of this patent is extended or adjusted under 35 U.S.C. 154(b) by 0 days.

(21) Appl. No.: 18/536,188

(22) Filed: Dec. 11, 2023

(65) Prior Publication Data

US 2024/0120238 A1     Apr. 11, 2024

Related U.S. Application Data

(63) Continuation of application No. 17/330,369, filed on May 25, 2021, which is a continuation of application No. PCT/JP2019/040926, filed on Oct. 17, 2019.

(30) Foreign Application Priority Data

Dec. 10, 2018   (JP) ................. 2018-230683

(51) Int. Cl.
*H01L 21/78*     (2006.01)
*H01L 21/306*    (2006.01)
(Continued)

(52) U.S. Cl.
CPC .... *H01L 21/7806* (2013.01); *H01L 21/30621* (2013.01); *H01L 21/6835* (2013.01); *H01L 21/02392* (2013.01); *H01L 21/02395* (2013.01); *H01L 21/02463* (2013.01); *H01L 21/02502* (2013.01); *H01L 21/02543* (2013.01);
(Continued)

(58) Field of Classification Search
CPC .......... H01L 21/7806; H01L 21/30621; H01L 21/6835; H01L 21/02392; H01L 21/02395; H01L 21/02463; H01L 21/02502; H01L 21/02543; H01L 21/02546;
(Continued)

(56) References Cited

U.S. PATENT DOCUMENTS

7,205,176 B2 *  4/2007  Chen ................. G02B 26/0833
                                                   438/69
9,412,816 B2 *  8/2016  Yang ................. H01L 29/42392
(Continued)

*Primary Examiner* — Vu A Vu
(74) *Attorney, Agent, or Firm* — JCIPRNET (57) ABSTRACT

A semiconductor substrate includes: a base substrate; a removal layer, and of which at least a portion is to be removed by performing etching; a semiconductor epitaxial layer provided above the removal layer; and a support member for supporting the semiconductor epitaxial layer in a state where the support member is in contact with side surfaces of the base substrate, the removal layer, and the semiconductor epitaxial layer such that the semiconductor epitaxial layer is positioned above the base substrate, the support member being cut off in a region in contact with the removal layer due to application of a force to the semiconductor epitaxial layer. The thickness of at least a portion of a region of the support member in contact with the removal layer is smaller than the thickness of other regions that are different from the at least the portion of the region in the support member.

10 Claims, 6 Drawing Sheets

(51) Int. Cl.
*H01L 21/683* (2006.01)
*H01L 21/02* (2006.01)

(52) U.S. Cl.
CPC ............... *H01L 21/02546* (2013.01); *H01L 2221/68363* (2013.01)

(58) Field of Classification Search
CPC . H01L 2221/68363; H01L 2221/68368; H01L 21/02002; H01L 21/30612
USPC ........................................................ 438/478
See application file for complete search history.

(56) References Cited

U.S. PATENT DOCUMENTS

| | | | |
|---|---|---|---|
| 9,685,539 B1 * | 6/2017 | Cheng | ............... H01L 29/66545 |
| 10,461,154 B1 * | 10/2019 | Song | ................... H01L 29/0673 |
| 10,643,836 B2 * | 5/2020 | Lin | ................... H01L 21/02104 |
| 11,087,974 B2 * | 8/2021 | Forrest | ............. H01L 21/02546 |

* cited by examiner

SEMICONDUCTOR SUBSTRATE, METHOD FOR MANUFACTURING SEMICONDUCTOR SUBSTRATE AND METHOD FOR MANUFACTURING SEMICONDUCTOR DEVICE

CROSS-REFERENCE TO RELATED APPLICATIONS

This application is a continuation application of and claims the priority benefit of a prior application Ser. No. 17/330,369 filed on May 25, 2021, now allowed. The prior application Ser. No. 17/330,369 is a continuation application of International Application No. PCT/JP2019/040926 filed Oct. 17, 2019, the disclosure of which is incorporated herein by reference in its entirety. Further, this application claims priority under 35 USC 119 from Japanese Patent Application No. 2018-230683 filed Dec. 10, 2018, the disclosure of which is incorporated by reference herein.

BACKGROUND

The present invention relates to a semiconductor substrate, a method for manufacturing a semiconductor substrate, and a method for manufacturing a semiconductor device using the semiconductor substrate. There is conventionally a known technique of forming a removal layer and a semiconductor epitaxial layer on a semiconductor substrate and separating the semiconductor epitaxial layer from the semiconductor substrate by removing the removal layer by performing etching (for example, see Japanese Patent No. 3813123).

In the technique described in Japanese Patent No. 3813123, after the removal layer and the semiconductor epitaxial layer are formed on a GaAs substrate serving as a base substrate for growing the semiconductor epitaxial layer, the semiconductor epitaxial layer is separated from the GaAs substrate by removing the removal layer using an etchant such as hydrofluoric acid. When separating the semiconductor epitaxial layer from the GaAs substrate in this method, the etching rates of the GaAs substrate and the semiconductor epitaxial layer are assumed to be significantly smaller than the etching rate of the removal layer.

When removing the removal layer by performing etching, the surface of the GaAs substrate and the bottom surface of the semiconductor epitaxial layer that are in contact with the removal layer become very flat. As a result, there has been a problem that the surface of the GaAs substrate might be bonded to the bottom surface of the separated semiconductor epitaxial layer after removing the removal layer by performing etching. If the surface of the GaAs substrate is bonded to the bottom surface of the semiconductor epitaxial layer after removing the removal layer by performing etching, the semiconductor epitaxial layer cannot be separated from the GaAs substrate. Thus, a technique of preventing the surface of the GaAs substrate and the bottom surface of the separated semiconductor epitaxial layer from being bonded to each other even after removing the removal layer is required.

SUMMARY

Therefore, the present invention has been made in view of these points, and an object thereof is to prevent the surface of a base substrate and the bottom surface of a separated semiconductor epitaxial layer from being bonded to each other even after a removal layer is removed.

A semiconductor substrate in the first embodiment of the present invention includes a base substrate; a removal layer that is provided on the base substrate, and of which at least a portion is to be removed by performing etching; a semiconductor epitaxial layer that is provided above the removal layer; a support member for supporting the semiconductor epitaxial layer in a state where the support member is in contact with side surfaces of the base substrate, the removal layer, and the semiconductor epitaxial layer such that the semiconductor epitaxial layer is positioned above the base substrate, the support member being cut off in a region in contact with the removal layer due to application of a force to the semiconductor epitaxial layer, wherein the thickness of at least a portion of a region of the support member in contact with the removal layer is smaller than the thickness of other regions that are different from the at least the portion of the region in the support member.

A method for manufacturing a semiconductor substrate in the second embodiment of the present invention includes the steps of: preparing a base substrate; forming a removal layer, of which at least a portion is to be removed by performing etching, on the base substrate; forming a semiconductor epitaxial layer above the removal layer; and providing a support member for supporting the semiconductor epitaxial layer in a state where the support member is in contact with side surfaces of the base substrate, the removal layer, and the semiconductor epitaxial layer such that the semiconductor epitaxial layer is positioned above the base substrate, after forming the semiconductor epitaxial layer, the thickness of at least a portion of a region of the support member in contact with the removal layer being smaller than the thickness of other regions that are different from the at least the portion of the region in the support member, the support member being cut off in a region in contact with the removal layer due to application of a force to the semiconductor epitaxial layer.

DETAILED DESCRIPTION OF THE INVENTION

Hereinafter, the present invention will be described through exemplary embodiments of the present invention, but the following exemplary embodiments do not limit the invention according to the claims, and not all of the combinations of features described in the exemplary embodiments are necessarily essential to the solution means of the invention.

<Configuration of a Semiconductor Substrate 1>

Figure 1:
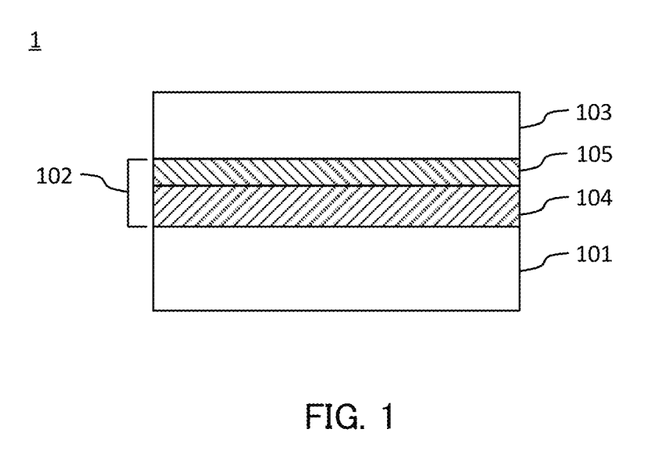
FIG. 1 is a schematic view showing a configuration of a semiconductor substrate 1 of the present embodiment.

FIG. 1 is a schematic view showing a configuration of a semiconductor substrate 1 of the present embodiment. FIG. 1 shows a cross-sectional structure of a semiconductor epitaxial wafer. The semiconductor substrate 1 includes a base substrate 101, a removal layer 102 provided on the base substrate 101, and a semiconductor epitaxial layer 103 provided above the removal layer 102.

The base substrate 101 is a base material substrate for crystal-growing the semiconductor epitaxial layer. A case where the base substrate 101 is composed of a group III-V semiconductor is described as an example in the present embodiment, but the base substrate 101 may be composed of a material other than a group III-V semiconductor.

The removal layer 102 is a layer, of which at least a portion is to be removed by performing etching. The removal layer 102 includes a first removal layer 104 provided on the base substrate 101 and a second removal layer 105 provided on the first removal layer 104. Although the details will be described later, an etching rate of the second removal layer 105 for a predetermined etching material is larger than an etching rate of the first removal layer 104 for the predetermined etching material. The predetermined etching material is an etchant or etching gas having a sufficiently larger etching rate of the second removal layer 105 than an etching rate of the semiconductor epitaxial layer 103. The etching rate of the second removal layer 105 is more than twice the etching rate of the first removal layer 104, for example.

In the following description, the predetermined etching material is referred to as a used etching material. Examples of the used etching material include hydrochloric acid, hydrofluoric acid, nitric acid, a mixture of hydrochloric acid and nitric acid, organic acid, hydrogen chloride gas, and chlorine gas.

Since the etching rate of the second removal layer 105 for the predetermined etching material is larger than the etching rate of the first removal layer 104 for the used etching material, at least a portion of the first removal layer 104 remains at the time when all of the second removal layer 105 is removed by performing etching. At this time, since the etching of the first removal layer 104 is in progress, the surface of the first removal layer 104, which is exposed at the time when the second removal layer 105 is removed by performing etching using the used etching material, is rougher than the surface of the semiconductor epitaxial layer 103 facing the second removal layer 105. Therefore, even if the semiconductor epitaxial layer 103, separated by removing the second removal layer 105, is in contact with the first removal layer 104, the semiconductor epitaxial layer 103 and the first removal layer 104 remain separated from each other.

<Composition of Each Layer>

The base substrate 101 is a GaAs substrate, for example. The semiconductor epitaxial layer 103 is a semiconductor epitaxial layer to be removed from the base substrate 101, and composed of $Al_tGa_{1-t}As$ (0≤t≤1), for example. The first removal layer 104 is composed of $Al_yGa_{1-x}As$ (0.6<x≤0.8), and the second removal layer 105 is composed of $Al_yGa_{1-y}As$ (0.7<y≤1, y>x), for example. More preferably, the first removal layer 104 is $Al_xGa_{1-x}As$ (0.75<x≤0.8) and the second removal layer 105 is $Al_yGa_{1-y}As$ (0.8<y≤1), as a range of material compositions of the first removal layer 104 and the second removal layer 105.

$Al_tGa_{1-t}As$ (0≤t≤0.6) is suitable as the material composition of a semiconductor layer constituting the bottom surface of the semiconductor epitaxial layer 103 in contact with the second removal layer 105 (a surface facing the second removal layer 105). It is more preferable that the semiconductor layer constituting the bottom surface of the semiconductor epitaxial layer 103 in contact with the second removal layer 105 is a GaAs layer.

<Thicknesses of the First Removal Layer 104 and the Second Removal Layer 105>

The thickness of the first removal layer 104 may be larger than the thickness of the second removal layer 105 so as to make at least a portion of the first removal layer 104 easily remain at the time when the second removal layer 105 is removed by performing etching using the used etching material. The thickness of the first removal layer 104 and the thickness of the second removal layer 105 may be such thicknesses that at least a portion of the first removal layer 104 remains over the entire region of the first removal layer 104, at the time when the second removal layer 105 is removed, even if speeds of etching are different depending on the location of the first removal layer 104.

Experimental Example

Figure 2A:
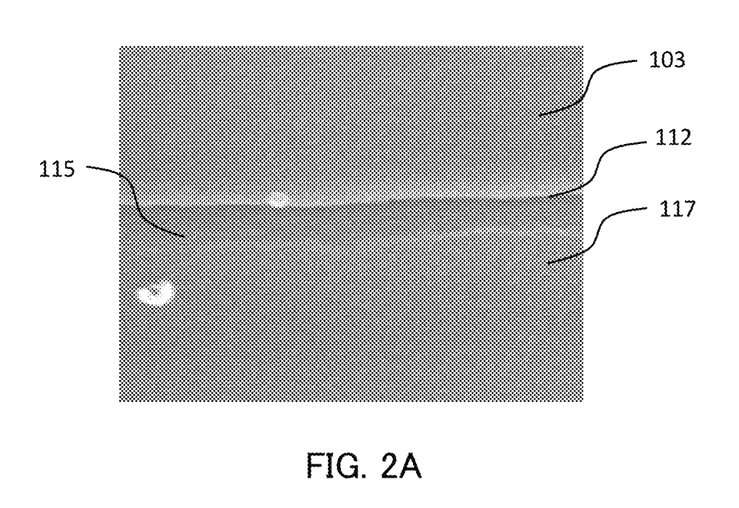
FIG. 2A is a micrograph of the semiconductor substrate 1 used in an experiment.

The semiconductor substrate 1 was produced and etched away in an experiment. In the semiconductor substrate 1 used in the experiment, the base substrate 101 was a GaAs substrate. The composition of the first removal layer 104 was $Al_xGa_{1-x}As$ (0.75<x≤0.8). The composition of the second removal layer 105 was $Al_yGa_{1-y}As$ (0.8<y≤1). The composition of the semiconductor epitaxial layer 103 was $Al_tGa_{1-t}As$ (0≤t≤0.6).

Figure 2B:
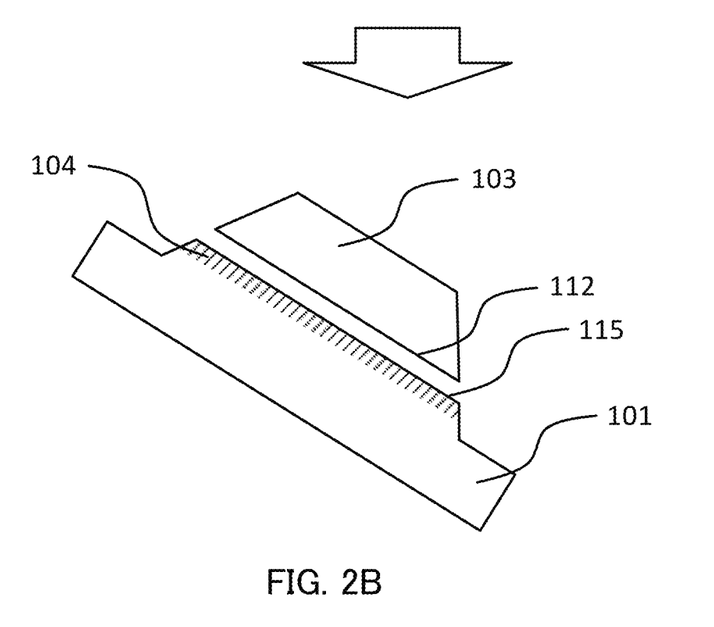
FIG. 2B is a schematic view showing an experimental result.

FIG. 2A is a micrograph of the semiconductor substrate used in the experiment. FIG. 2B is a schematic view showing the experimental result. The micrograph shown in FIG. 2A is a photograph obtained by imaging using a Scanning Electron Microscope (SEM) from the arrow direction, while inclining the semiconductor substrate 1 as shown in FIG. 2B.

The photograph shown in FIG. 2A shows a state where the second removal layer 105 is completely etched away by the etchant and a portion of the first removal layer 104 is etched away. As shown in FIG. 2A, it can be confirmed that there is a gap between the semiconductor epitaxial layer 103 to be separated from the semiconductor substrate 1 and a remaining layer 117, which is a layer where a portion of the first removal layer 104 remains.

Further, it can be confirmed that an upper surface 115 of the remaining layer 117 is a rough surface having irregularities whereas a lower surface 112 of the semiconductor epitaxial layer 103 is flat in FIG. 2A. This is because the etching rate of the first removal layer 104 for the etchant used was smaller than the etching rate of the second removal layer 105, and so only a portion of the first removal layer 104 was etched away while the second removal layer 105 was completely etched away.

After removing the second removal layer 105 by performing etching, the upper surface of the remaining layer 117, a layer in which a portion of the first removal layer 104 remained, becomes a rough surface, thereby preventing the semiconductor epitaxial layer 103 from being bonded to a surface on the base substrate 101 side (that is, the remaining layer 117 remaining on the base substrate 101) after removing the second removal layer 105 by performing etching. Therefore, the semiconductor epitaxial layer 103 can be separated from the base substrate 101 properly.

At least a surface roughness Ra of the bottom surface of the semiconductor epitaxial layer 103 (that is, the surface facing the removed second removal layer 105) is preferably smaller than a surface roughness Rb of the upper surface of the remaining layer 117. The surface roughness is an average roughness measured by an Atomic Force Microscope (AFM), for example.

According to the experiment by the inventor, after the second removal layer 105 has been etched away until completely being removed, it was confirmed that the semiconductor epitaxial layer 103, even when loading the semiconductor epitaxial layer 103 in the direction of the base substrate 101, can be separated from the base substrate 101 without bonding the semiconductor epitaxial layer 103 to the first removal layer 104.

Figure 3:
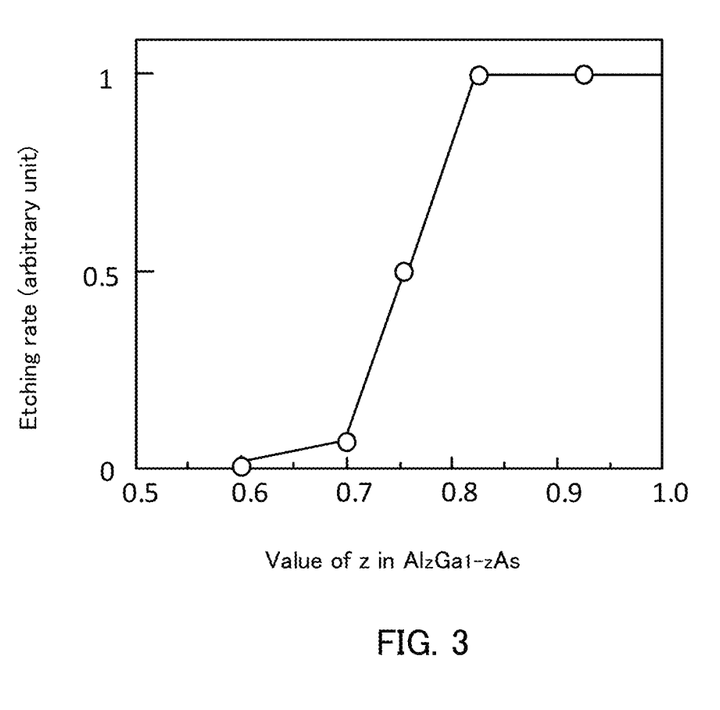
FIG. 3 shows a relation between an etching rate of $Al_zGa_{1-z}As$ and a composition z.

FIG. 3 shows a relation between an etching rate of $Al_zGa_{1-z}As$ confirmed in an etching experiment in which the inventor used hydrochloric acid as an etchant for removing the second removal layer 105 and a value z that defines the composition of $Al_zGa_{1-z}As$. The vertical axis in FIG. 3 is a relative value in a case where the etching rate is 1 when z=1. It can be confirmed from the result of FIG. 3 that a combination of the first removal layer 104 and the second removal layer 105 having a large difference between the etching rate of the first removal layer 104 and the etching rate of the second removal layer 105 can be selected by setting the composition of the first removal layer 104 to be $Al_xGa_{1-x}As$ ($0.6 < x \leq 0.8$) and the composition of the second removal layer 105 to be $Al_yGa_{1-y}As$ ($0.7 < y \leq 1$, $y > x$).

<Variation Example of the Configuration of the Semiconductor Substrate 1>

In FIG. 1, a structure in which the removal layer 102 includes two layers, the first removal layer 104 and the second removal layer 105, has been exemplified, but the semiconductor substrate 1 may include other removal layers in addition to the two layers including the first removal layer 104 and the second removal layer 105. At this time, it is desirable that layers are stacked from the side of the removal layer 102 in contact with the base substrate 101 towards the side of the removal layer 102 in contact with the semiconductor epitaxial layer 103 in an order in which the etching rates become larger.

The semiconductor substrate 1 may further include a third removal layer between the first removal layer 104 and the second removal layer 105, for example. In this case, the etching rate of the third removal layer for the used etching material is larger than the etching rate of the first removal layer 104 for the used etching material, and is less than the etching rate of the second removal layer 105 for the used etching material.

In the above description, a case where the base substrate 101 is a GaAs substrate is exemplified, but the present invention is also applicable to a case where the base substrate 101 is another group III-V semiconductor epitaxial substrate. In the semiconductor substrate 1, the base substrate 101 may be an InP substrate, and the semiconductor epitaxial layer 103 may be a semiconductor epitaxial layer (e.g., $In_{1-x}Ga_xAs_yP_{1-y}$ ($0 \leq x$, $y \leq 1$)) that lattice-matches or approximately lattice-matches on the InP substrate, for example. Here, the removal layer 102 is a semiconductor layer that lattice-matches or approximately lattice-matches on the InP substrate, and the first removal layer 104 is $In_{0.52}Al_{0.48}As$ and the second removal layer 105 is $In_{0.53}Ga_{0.47}As$, for example.

<Method for Manufacturing a Semiconductor Device>

Subsequently, a method for manufacturing a semiconductor device by moving the semiconductor epitaxial layer 103 to another substrate after separating the semiconductor epitaxial layer 103 from the base substrate 101 will be described.

FIG. 4 (FIGS. 4A to 4D) is for explaining the method for manufacturing a semiconductor device. First, the semiconductor substrate 1 shown in FIG. 1 is prepared. The semiconductor substrate 1 is manufactured by forming the semiconductor epitaxial layer 103 on the second removal layer 105 after forming a stacked structure including the first removal layer 104 and the second removal layer 105 on the base substrate 101, for example. The semiconductor epitaxial layer 103 has a semiconductor stacked structure for forming a predetermined device. The predetermined device is any device composed of a semiconductor, such as a light-emitting diode, a transistor, a sensor, or the like.

It should be noted that, in the present manufacturing method, the semiconductor device may be manufactured using a manufactured semiconductor substrate 1 instead of manufacturing the semiconductor substrate 1. That is, a step of preparing the semiconductor substrate 1, in which the first removal layer 104, the second removal layer 105 and the semiconductor epitaxial layer 103 have already been formed on the base substrate 101, may be the first step in the method for manufacturing the semiconductor substrate. Further, a step of preparing the semiconductor substrate 1, in which a predetermined device structure or a portion of the predetermined device structure has already been formed in the semiconductor epitaxial layer 103, may be the first step in the method for manufacturing the semiconductor device.

Figure 4A:
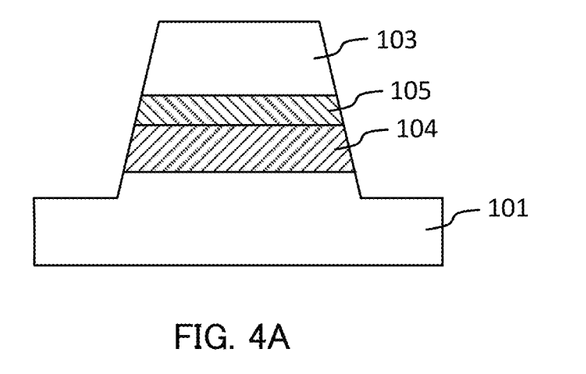
FIG. 4A is for explaining a method for manufacturing a semiconductor device.

Next, an island where at least a portion of the second removal layer 105 to be removed by performing etching (e.g., an outer peripheral surface) is exposed is formed as shown in FIG. 4A. The island shown in FIG. 4A is formed by etching a predetermined area from an outer periphery of the semiconductor epitaxial layer 103, the first removal layer 104, and the second removal layer 105 in the semiconductor substrate 1, for example.

Figure 4B:
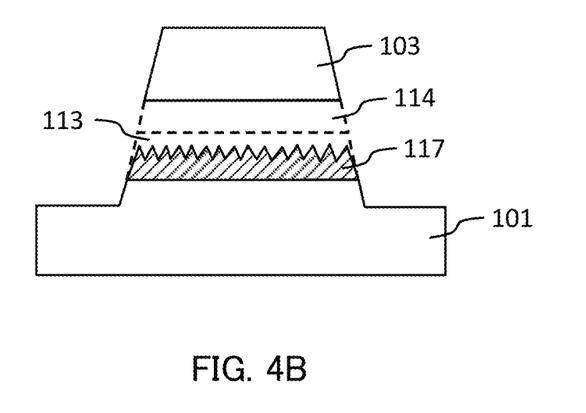
FIG. 4B is for explaining the method for manufacturing the semiconductor device.

Subsequently, as shown in FIG. 4B, the first removal layer 104 and the second removal layer 105 are etched away by a predetermined etchant. In the etching step, the etching is continued until the second removal layer 105 is completely removed, and the etching is stopped at the time when the second removal layer 105 is removed. In this way, a void 114 is formed by completely removing the second removal layer 105. A partial region of the first removal layer 104 on the second removal layer 105 side (a region 113 in FIG. 4B) is removed, and the remaining layer 117 of the first removal layer 104 having a rough surface with irregularities formed on the surface of the first removal layer 104, which is opposite to the surface of the first removal layer 104 in contact with the base substrate 101, is formed. It should be noted that the formed irregularities are shown in FIG. 4B in an exaggerated manner.

Figure 4C:
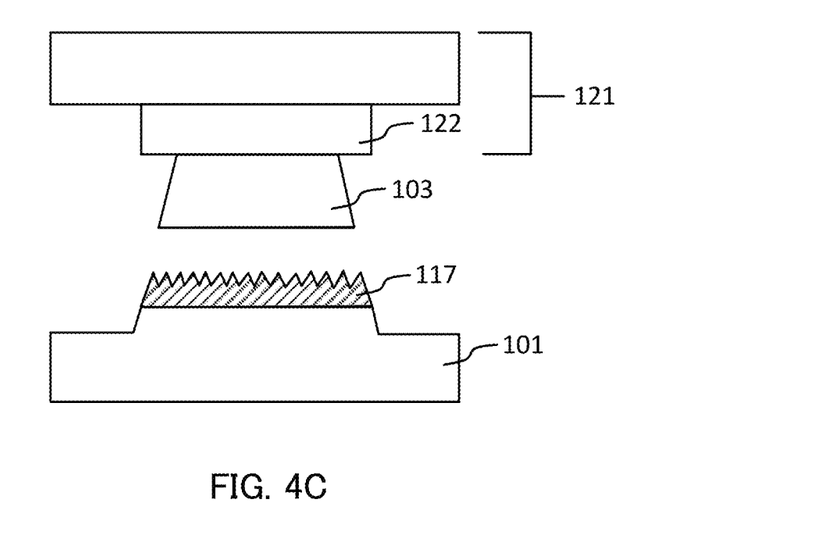
FIG. 4C is for explaining the method for manufacturing the semiconductor device.

Subsequently, as shown in FIG. 4C, the semiconductor epitaxial layer 103 is separated from the base substrate 101 using a pick-up substrate 121 including a pick-up bump 122, for example. The pick-up bump 122 is an organic material layer and can be formed by a standard photolithography process by applying a photosensitive organic material on a semiconductor substrate, for example. The organic material layer may be formed by applying an organic material on a pick-up base substrate serving as a base of the pick-up substrate 121 using a spin-coating method, a dip method, or the like, or may be formed by attaching an organic material film on the pick-up base substrate, for example.

Figure 4D:
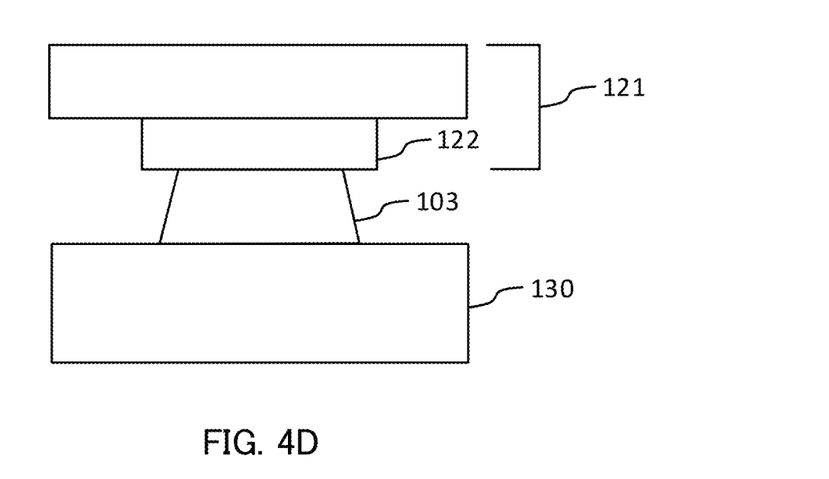
FIG. 4D is for explaining the method for manufacturing the semiconductor device.

Subsequently, as shown in FIG. 4D, the semiconductor epitaxial layer 103 separated from the base substrate 101 by the pick-up substrate 121 is bonded onto a destination substrate 130 by pressure. A surface treatment process, such as a bonding surface activation process, may be performed prior to the bonding. Further, as a material layer different from the material of the destination substrate 130, another semiconductor layer, a metal layer, or an insulating film layer may be provided on the destination substrate 130, for example.

The pick-up substrate 121 is separated after bonding the semiconductor epitaxial layer 103 onto the destination substrate 130 (not shown). Manufacturing of the semiconductor device is completed by appropriately forming an interlayer insulating film, a metal wiring film, or the like on the semiconductor epitaxial layer 103 after separating the pick-up substrate 121.

Variation Example 1

After forming an island including the semiconductor epitaxial layer 103, the first removal layer 104, and the second removal layer 105 on the base substrate 101 as shown in FIG. 4A, a support member may be provided to support the semiconductor epitaxial layer 103 such that the semiconductor epitaxial layer 103 is positioned above the base substrate 101.

Figure 5:
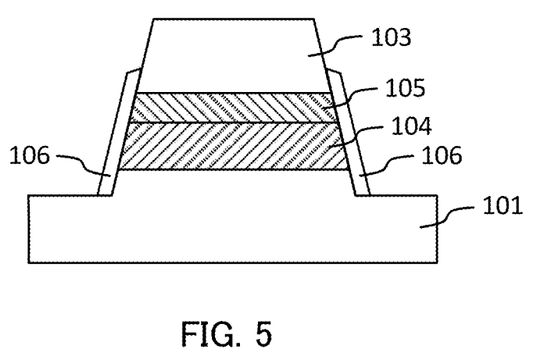
FIG. 5 shows an example in which a support member is provided.

FIG. 5 shows an example in which a support member 106 is provided. The support member 106 is a semiconductor thin film, an organic thin film, or an inorganic thin film that couples the semiconductor epitaxial layer 103 and the base substrate 101, for example. The support member 106 is formed such that a partial region of the support member 106 is in contact with side surfaces of the first removal layer 104 and the second removal layer 105, for example. A portion of the support member 106 may be formed such that the support member 106 extends to the top surface of the semiconductor epitaxial layer 103 or the surface where the base substrate 101 is exposed. The thin film constituting the support member 106 has a sufficiently smaller etching rate for the etching material used in removing the second removal layer 105 than the etching rate of the second removal layer 105, and remains in a state where the semiconductor epitaxial layer 103 and the base substrate 101 are coupled to each other at the time when the second removal layer 105 is removed.

The support member 106 may be formed in the following manner, for example. When forming the support member 106 from a semiconductor thin film such as amorphous Si or poly-Si, the semiconductor thin film can be formed by appropriately selecting a sputtering method, a Thermal Chemical Vapor Deposition (TCVD) method, a Plasma Chemical Vapor Deposition (PCVD) method, or a Low Pressure Chemical Vapor Deposition (LPCVD) method, for example. In this case, after forming the semiconductor thin film, a structure of the support member 106 can be formed by dry etching such as photolithography and a Reactive Ion Etching method (RIE), or wet etching using a predetermined etchant.

When forming the support member 106 from an inorganic thin film, the inorganic thin film can be formed by a sputtering method, a thermal CVD method or a PCVD method, for example. After forming the inorganic thin film, the structure of the support member 106 can be formed by dry etching such as photolithography and an RIE method or wet etching using a predetermined etchant.

When forming the support member 106 from an organic material thin film, the support member 106 can be formed by applying or attaching a photosensitive organic material, and then forming a predetermined structure by photolithography, followed by performing a baking treatment, for example. For the etchant used in forming the structure of the support member 106, it is desirable to select an etchant or etching gas having smaller etching rates of the first removal layer, the second removal layer and the semiconductor epitaxial layer 103 compared to the etching rate of the support member 106.

In this way, providing the support member 106 in a step of removing the second removal layer 105 makes it possible to reduce the possibility that the semiconductor epitaxial layer 103 comes into contact with the first removal layer 104 or the base substrate 101. In particular, providing the first removal layer 104 having a smaller etching rate than the second removal layer 105 makes it possible to prevent the semiconductor epitaxial layer 103 from being bonded to the base substrate 101 even if the thin film constituting the support member 106 is damaged or does not remain.

It should be noted that the support member 106 is preferably formed such that the support member 106 is easily cut off when a force is applied in a direction in which the semiconductor epitaxial layer 103 moves away from the base substrate 101. The support member 106 has a shape (e.g., a groove) in which the thickness of a portion of the region in contact with the side surface of the second removal layer 105 is smaller than the thickness of other regions, and so the support member 106 can be easily cut off after the second removal layer 105 is removed, for example. In this case, a step of cutting off the support member 106 by pulling up the semiconductor epitaxial layer 103 may further be included between a removing step of removing the second removal layer 105 by performing etching using a predetermined material and a bonding step of bonding the semiconductor epitaxial layer 103 to the destination substrate 130 that is different from the base substrate 101.

The support member 106 whose thickness of a predetermined region is smaller than the thickness of the other regions can be manufactured by the following method, for example. First, regions other than a region whose thickness is to be reduced (for example, a region where a groove is formed), is covered with a resist. Subsequently, after performing etching such that the thickness of the support member 106 becomes a predetermined thickness by the wet etching using an etchant for etching the material of the support member 106 or the dry etching such as RIE, the resist is removed.

Variation Example 2

In the above description, a case where the etching rate of the second removal layer 105 for the predetermined etching material described above is larger than the etching rate of the first removal layer 104 has been exemplified, but the etching rate of the first removal layer 104 may be equal to or larger than the etching rate of the second removal layer 105. In this case, however, the thickness of the first removal layer 104 is required to be larger than the thickness of the second removal layer 105 so that at least a portion of the first removal layer 104 remains when the removal of the second removal layer 105 by performing etching is completed.

<Effects of the Semiconductor Substrate 1>

The semiconductor substrate 1 of the present invention includes at least two removal layers having different etching rates between the semiconductor epitaxial layer 103 to be separated from the base substrate 101 and the base substrate 101. Therefore, it is possible to prevent the semiconductor epitaxial layer 103 from being bonded to the base substrate 101 after the semiconductor epitaxial layer 103 is separated.

Further, by manufacturing a semiconductor device using the semiconductor substrate 1, the semiconductor epitaxial layer 103 having a flat surface is easily moved to the destination substrate 130, and the semiconductor epitaxial layer 103 that has been moved is then processed, and thus it is possible to manufacture various semiconductor devices.

The present invention is explained on the basis of the exemplary embodiments. The technical scope of the present invention is not limited to the scope explained in the above embodiments and it is possible to make various changes and modifications within the scope of the invention. For example, the specific embodiments of the distribution and integration of the apparatus are not limited to the above embodiments, all or part thereof, can be configured with any unit which is functionally or physically dispersed or integrated. Further, new exemplary embodiments generated by arbitrary combinations of them are included in the exemplary embodiments of the present invention. Further, effects of the new exemplary embodiments brought by the combinations also have the effects of the original exemplary embodiments.

What is claimed is:

1. A semiconductor substrate, comprising:
   a base substrate;
   a removal layer that is provided on the base substrate, and of which at least a portion is to be removed by performing etching;
   a semiconductor epitaxial layer that is provided above the removal layer;
   a support member for supporting the semiconductor epitaxial layer in a state where the support member is in contact with side surfaces of the base substrate, the removal layer, and the semiconductor epitaxial layer such that the semiconductor epitaxial layer is positioned above the base substrate, the support member being cut off in a region in contact with the removal layer due to application of a force to the semiconductor epitaxial layer, wherein
   the thickness of at least a portion of a region of the support member in contact with the removal layer is smaller than the thickness of other regions that are different from the at least the portion of the region in the support member, wherein
   the base substrate is composed of GaAs,
   the semiconductor epitaxial layer is composed of $Al_tGa_{1-t}As$ ($0 \leq t \leq 1$), and
   the removal layer is composed of $Al_xGa_{1-x}As$ ($0.6 \leq x \leq 1$).

2. The semiconductor substrate according to claim 1, wherein
   a groove is formed in the at least the portion of the region in the support member.

3. The semiconductor substrate according to claim 1, wherein
   the support member extends to a top surface of the semiconductor epitaxial layer or a surface where the base substrate is exposed.

4. The semiconductor substrate according to claim 1, wherein
   the removal layer includes:
   a first removal layer provided on the base substrate; and
   a second removal layer provided above the first removal layer, wherein
   the thickness of a portion of a region of the support member in contact with the second removal layer is smaller than the thickness of other regions.

5. A method for manufacturing a semiconductor substrate comprising the steps of:
   preparing a base substrate;
   forming a removal layer, of which at least a portion is to be removed by performing etching, on the base substrate;
   forming a semiconductor epitaxial layer above the removal layer; and
   providing a support member for supporting the semiconductor epitaxial layer in a state where the support member is in contact with side surfaces of the base substrate, the removal layer, and the semiconductor epitaxial layer such that the semiconductor epitaxial layer is positioned above the base substrate, after forming the semiconductor epitaxial layer, the thickness of at least a portion of a region of the support member in contact with the removal layer being smaller than the thickness of other regions that are different from the at least the portion of the region in the support member, the support member being cut off in a region in contact with the removal layer due to application of a force to the semiconductor epitaxial layer, further comprising:
   removing at least a portion of the removal layer by performing etching using a predetermined etching material, and
   cutting off the support member by applying a force in a direction in which the semiconductor epitaxial layer moves away from the base substrate.

6. A method for manufacturing a semiconductor device, comprising the steps of:
   preparing a semiconductor, wherein the semiconductor substrate comprising:
   a base substrate;
   a removal layer that is provided on the base substrate, and of which at least a portion is to be removed by performing etching;
   a semiconductor epitaxial layer that is provided above the removal layer;
   a support member for supporting the semiconductor epitaxial layer in a state where the support member is in contact with side surfaces of the base substrate, the removal layer, and the semiconductor epitaxial layer such that the semiconductor epitaxial layer is positioned above the base substrate, the support member being cut off in a region in contact with the removal layer due to application of a force to the semiconductor epitaxial layer, wherein
   the thickness of at least a portion of a region of the support member in contact with the removal layer is smaller than the thickness of other regions that are different from the at least the portion of the region in the support member;
   removing at least a portion of the removal layer by performing etching using a predetermined etching material;
   cutting off the support member by applying a force in a direction in which the semiconductor epitaxial layer moves away from the base substrate after the removing; and
   bonding the semiconductor epitaxial layer to a destination substrate that is different from the base substrate after the cutting off.

7. A semiconductor substrate, comprising:

a base substrate;

a removal layer that is provided on the base substrate, and of which at least a portion is to be removed by performing etching;

a semiconductor epitaxial layer that is provided above the removal layer;

a support member for supporting the semiconductor epitaxial layer in a state where the support member is in contact with side surfaces of the base substrate, the removal layer, and the semiconductor epitaxial layer such that the semiconductor epitaxial layer is positioned above the base substrate, the support member being cut off in a region in contact with the removal layer due to application of a force to the semiconductor epitaxial layer, wherein the thickness of at least a portion of a region of the support member in contact with the removal layer is smaller than the thickness of other regions that are different from the at least the portion of the region in the support member, wherein the base substrate is composed of InP, the semiconductor epitaxial layer is $In_{1-x}Ga_xAs_yP_{1-y}$ ($0 \leq x, y \leq 1$), and the removal layer is a semiconductor layer that lattice-matches on the base substrate.

8. The semiconductor substrate according to claim 7, wherein a groove is formed in the at least the portion of the region in the support member.

9. The semiconductor substrate according to claim 7, wherein the support member extends to a top surface of the semiconductor epitaxial layer or a surface where the base substrate is exposed.

10. The semiconductor substrate according to claim 7, wherein the removal layer includes:

a first removal layer provided on the base substrate; and a second removal layer provided above the first removal layer, wherein the thickness of a portion of a region of the support member in contact with the second removal layer is smaller than the thickness of other regions.

* * * * *